(12) United States Patent
Huang

(10) Patent No.: US 10,950,668 B2
(45) Date of Patent: Mar. 16, 2021

(54) DISPLAY SUBSTRATE AND MANUFACTURING METHOD THEREOF, AND DISPLAY APPARATUS

(71) Applicant: BOE Technology Group Co., Ltd., Beijing (CN)

(72) Inventor: Wei Huang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/578,731

(22) PCT Filed: May 24, 2017

(86) PCT No.: PCT/CN2017/085693
§ 371 (c)(1),
(2) Date: Dec. 1, 2017

(87) PCT Pub. No.: WO2018/006661
PCT Pub. Date: Jan. 11, 2018

(65) Prior Publication Data
US 2018/0301515 A1 Oct. 18, 2018

(30) Foreign Application Priority Data

Jul. 8, 2016 (CN) .......................... 201610538504.8

(51) Int. Cl.
*G06F 3/044* (2006.01)
*G06F 3/041* (2006.01)
(Continued)

(52) U.S. Cl.
CPC .......... *H01L 27/323* (2013.01); *G06F 3/0412* (2013.01); *G06F 3/0445* (2019.05);
(Continued)

(58) Field of Classification Search
None
See application file for complete search history.

(56) References Cited

U.S. PATENT DOCUMENTS

| 2011/0299134 A1 | 12/2011 | Shimoyama et al. |
| 2014/0111476 A1 | 4/2014 | You et al. |

(Continued)

FOREIGN PATENT DOCUMENTS

| CN | 102646006 A | 8/2012 |
| CN | 102903423 A | 1/2013 |

(Continued)

OTHER PUBLICATIONS

International search report dated Sep. 5, 2017 for corresponding application PCT/CN2017/085693 with English translation.

(Continued)

*Primary Examiner* — Nicholas J Lee
(74) *Attorney, Agent, or Firm* — Nath, Goldberg & Meyer; Joshua B. Goldberg

(57) ABSTRACT

The present application provides a display substrate, a manufacturing method thereof, and a display apparatus. The display substrate of the present invention includes a base substrate, a display unit provided on the base substrate, a color filter layer provided on the display unit, a planarization layer provided on a surface of the color filter layer distal to the display unit, and a plurality of first electrodes and a plurality of second electrodes provided in the planarization layer. The planarization layer includes a first planarization layer and a second planarization layer, the plurality of first electrode are embedded in the first planarization layer, and the plurality of second electrodes are embedded in the second planarization layer.

11 Claims, 6 Drawing Sheets

(51) Int. Cl.
*H01L 27/32* (2006.01)
*H01L 51/56* (2006.01)
*H01L 51/52* (2006.01)

(52) U.S. Cl.
CPC ........ *H01L 27/322* (2013.01); *H01L 27/3211* (2013.01); *H01L 27/3246* (2013.01); *H01L 51/5253* (2013.01); *H01L 51/56* (2013.01); *G06F 2203/04103* (2013.01); *H01L 51/5284* (2013.01)

(56) References Cited

U.S. PATENT DOCUMENTS

| | | | | |
|---|---|---|---|---|
| 2014/0116754 | A1* | 5/2014 | Gao | G06F 3/044 |
| | | | | 174/250 |
| 2014/0239272 | A1* | 8/2014 | Kim | H01L 51/5218 |
| | | | | 257/40 |
| 2015/0034920 | A1* | 2/2015 | Jang | H01L 51/5256 |
| | | | | 257/40 |
| 2017/0228054 | A1* | 8/2017 | Wu | G06F 3/041 |

FOREIGN PATENT DOCUMENTS

| | | |
|---|---|---|
| CN | 104376899 A | 2/2015 |
| CN | 105045455 A | 11/2015 |
| CN | 105957878 A | 9/2016 |
| CN | 205789984 U | 12/2016 |

OTHER PUBLICATIONS

Chinese office action dated May 3, 2018 for corresponding CN application 201610538504.8 with English translation attached.

* cited by examiner

DISPLAY SUBSTRATE AND MANUFACTURING METHOD THEREOF, AND DISPLAY APPARATUS

This is a National Phase Application filed under 35 U.S.C. 371 as a national stage of PCT/CN2017/085693, filed May 24, 2017, an application claiming the benefit of Chinese Application No. 201610538504.8, filed Jul. 8, 2016, the content of each of which is hereby incorporated by reference in its entirety.

TECHNICAL FIELD

The present disclosure belongs to the field of display technology, and particularly relates to a display substrate, a manufacturing method thereof, and a display apparatus.

BACKGROUND

Display screens (touch screens) with a touch function have been applied more and more widely. Capacitive touch screens are an important form of touch screens. A capacitive touch screen is provided with a plurality of driving electrodes (Tx) and a plurality of sensing electrodes (Rx) intersecting with each other, and capacitance is formed at an intersection of a driving electrode and a sensing electrode. Each driving electrode is applied with a driving signal in a form of scanning, and accordingly a sensing signal is generated on a sensing electrode. When a touch occurs, a human body or a touch pen comes into contact with a touch control area, the capacitance between the driving electrode and the sensing electrode in this area is affected, and the sensing signal of the corresponding sensing electrode is changed, so that a touch position can be determined.

SUMMARY

In one aspect, the present disclosure provides a display substrate including a base substrate, a display unit provided on the base substrate, a color filter layer provided on the display unit, a planarization layer provided on a surface of the color filter layer distal to the display unit, and a plurality of first electrodes and a plurality of second electrodes provided in the planarization layer; wherein the planarization layer includes a first planarization layer and a second planarization layer, the plurality of first electrodes are embedded in the first planarization layer, and the plurality of second electrodes are embedded in the second planarization layer.

Optionally, a plurality of first grooves are provided in the first planarization layer; a plurality of second grooves are provided in the second planarization layer; orthogonal projections of the plurality of first grooves on the base substrate intersect with orthogonal projections of the plurality of second grooves on the base substrate; each of the plurality of first grooves is filled with a respective one or more of the plurality of first electrodes; and each of the plurality of second grooves is filled with a respective one of the plurality of second electrodes.

Optionally, the color filter layer includes color filter blocks and black matrix blocks alternately arranged in a horizontal direction, and orthogonal projections of the black matrix blocks on the base substrate completely cover the orthogonal projections of the first electrodes and the second electrodes on the base substrate.

Optionally, the display unit includes a plurality of organic electroluminescent devices, and the color filter layer includes a plurality of color filter blocks, wherein the organic electroluminescent devices and the color filter blocks in the color filter layer are provided correspondingly.

Optionally, the plurality of organic electroluminescent devices include a red organic electroluminescent device, a green organic electroluminescent device and a blue organic electroluminescent device.

Optionally, each of the plurality of organic electroluminescent devices is a white organic electroluminescent device.

Optionally, the display substrate further includes an encapsulation layer provided between the organic electroluminescent devices and the color filter layer.

Optionally, the display substrate further includes a pixel define layer provided on the base substrate, the pixel define layer defining the plurality of organic electroluminescent devices; wherein an orthographic projection of the pixel define layer on the base substrate completely covers the orthographic projections of the first electrodes and the second electrodes on the base substrate.

Optionally, the organic electroluminescent device includes: an anode layer, a light-emitting layer and a cathode layer; wherein, the anode layer is provided on the base substrate, the pixel define layer is provided on the anode layer and has an opening exposing a part of the anode layer; the light emitting layer is provided in the opening of the pixel define layer and on the part of the anode layer exposed by the opening; and the cathode layer is provided on the pixel define layer and the light emitting layer; alternatively, the cathode layer is provided on the base substrate, the pixel define layer is provided on the cathode layer and has an opening exposing a part of the cathode layer; the light emitting layer is provided in the opening of the pixel define layer and on the part of the cathode layer exposed by the opening; and the anode layer is provided on the pixel define layer and the light emitting layer.

Optionally, the display unit includes a plurality of pixel electrodes.

Optionally, the plurality of first electrodes and the plurality of second electrodes intersect with each other, wherein a distance between two adjacent second electrodes in a horizontal direction is 100 μm to 2000 μm.

Optionally, each of the first grooves and the second grooves has a width of 3 μm to 20 μm.

Optionally, each of the first grooves and the second grooves has a depth of 1 μm to 5 μm.

Optionally, the first electrodes and the second electrodes include at least one of silver, gold, copper and aluminum.

In another aspect, the present disclosure provides a manufacturing method of the above display substrate, including steps of:

forming a display unit on a base substrate;

forming a color filter layer on a layer where the display unit is located;

forming a first planarization layer on a surface of the color filter layer distal to the display unit;

forming a plurality of first grooves in the first planarization layer;

forming first electrodes in the first grooves;

forming a second planarization layer on a side of the first planarization layer distal to the color filter layer;

forming a plurality of second grooves in the second planarization layer; and forming second electrodes in the second grooves.

Optionally, the first planarization layer and the second planarization layer both are formed by inkjet printing.

Optionally, the step of forming a plurality of first grooves in the first planarization layer includes:

performing imprinting on a surface of the first planarization layer distal to the base substrate to form the first grooves on the surface of the first planarization layer; and the step of forming a plurality of second grooves in the second planarization layer includes:

performing imprinting on a surface of the second planarization layer distal to the base substrate to form the second grooves on the surface of the second planarization layer.

Optionally, the imprinting is performed in nitrogen ($N_2$) environment or vacuum environment.

Optionally, the step of forming first electrodes in the first grooves specifically includes:

printing metal nano-particle ink into the first grooves by inkjet printing; and performing conductive treatment on the metal nano-particle ink by using photon sintering or laser pulse sintering to form the first electrodes; and the step of forming second electrodes in the second grooves specifically includes:

printing metal nano-particle ink into the second grooves by inkjet printing; and performing conductive treatment on the metal nano-particle ink by using photon sintering or laser pulse sintering to form the second electrodes.

In another aspect, the present disclosure provides a display apparatus including the above display substrate.

DETAILED DESCRIPTION

Figure 1:
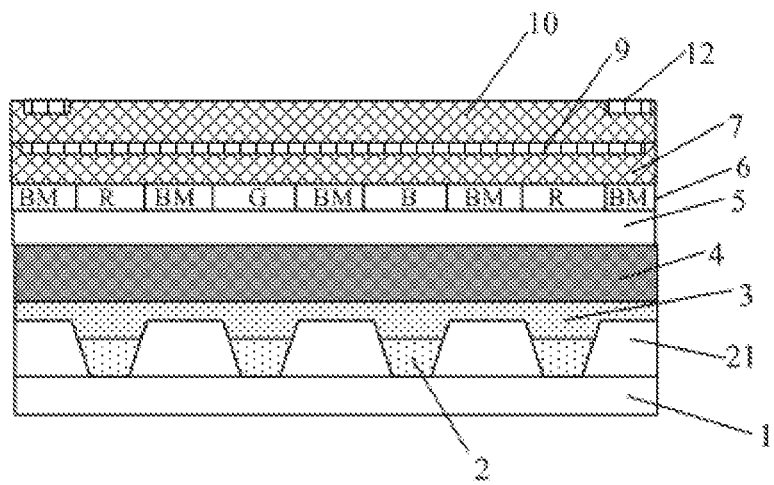
FIGS. 1 and 2 are structural diagrams of a display substrate according to an embodiment of the present disclosure.

To enable those skilled in the art to better understand technical solutions of the present disclosure, the present disclosure will be further described in detail below in conjunction with the accompanying drawings and specific implementations.

In one aspect, embodiments of the present disclosure provide a display substrate. Referring to FIGS. 1 to 5, the display substrate includes a base substrate 1, a display unit provided on the base substrate 1, a color filter layer 6 provided on the display unit, and a first planarization layer 7 and a second planarization layer 10 sequentially provided on a side of the color filter layer 6 distal to the base substrate 1, wherein a plurality of first electrodes 11 are embedded in the first planarization layer 7, and a plurality of second electrodes 12 are embedded in the second planarization layer 10. For example, a plurality of first grooves 8 are provided on the first planarization layer 7, a plurality of second grooves 11 are provided on the second planarization layer 10, and orthogonal projections of the plurality of first grooves 8 on the base substrate 1 intersect with orthogonal projections of the plurality of second grooves 11 on the base substrate 1. The first electrodes 9 are filled in the first grooves 8; and the second electrodes 12 are filled in the second grooves 11. The first planarization layer 7 is in contact with the color filter layer 6, and the second planarization layer 10 is in contact with the first planarization layer.

It could be understood that one of the first electrode 9 and the second electrode 12 may serve as a touch control electrode and the other may serve as a sensing electrode. That is, in the display substrate in the embodiment of the present disclosure, the touch control electrodes and the sensing electrodes that implement the touch control function are formed together in a planarization layer (e.g., the first planarization layer 7 and the second planarization layer 10) on the color filter layer, so that the display substrate has improved integration and increased functions. In the meanwhile, the touch control electrodes and the sensing electrodes are provided in the grooves of the first planarization layer 7 and the second planarization layer 10, so that the touch function can be achieved without additionally increasing thickness of an organic light emitting diode substrate.

Figure 3:
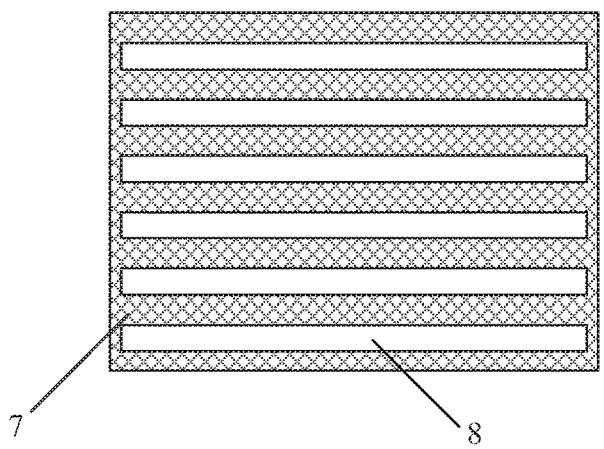
FIG. 3 is a schematic diagram illustrating first grooves of a display substrate according to an embodiment of the present disclosure.
Figure 4:
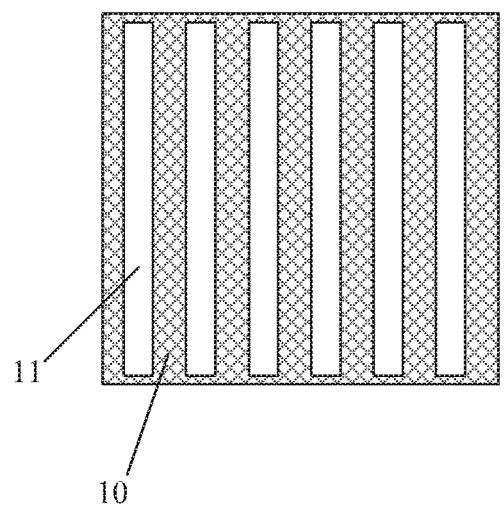
FIG. 4 is a schematic diagram illustrating second grooves of a display substrate according to an embodiment of the present disclosure.

As shown in FIGS. 3 and 4, the first grooves 8 and the second grooves 11 are preferably stripe-like. Needless to say, other shapes such as a shape of a pulse, a sine wave, a sawtooth, etc., may be used.

The color filter layer 6 may include color filter blocks (e.g., color filter blocks R, G, B in the drawings) and black matrix blocks (e.g., black matrix blocks BM in the drawings) alternately arranged in a horizontal direction, and orthogonal projections of the black matrix blocks on the base substrate 1 completely cover the orthogonal projections of the first electrodes 9 and the second electrodes 12 on the base substrate 1. In this way, the first electrodes and the second electrodes, for example, for touch control, can be shielded by the black matrix so as not to affect light emission of the display substrate.

Figure 5:
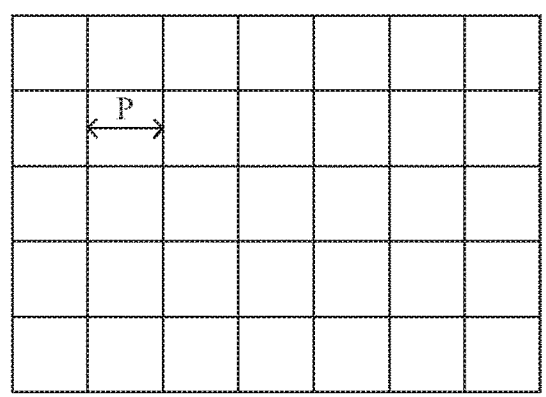
FIG. 5 is a schematic diagram illustrating that first electrodes and second electrodes of a display substrate intersect with each other according to an embodiment of the present disclosure.

Optionally, as shown in FIG. 5, the plurality of first electrodes 9 and the plurality of second electrodes 12 in an embodiment of the present disclosure intersect with each other (defining a grid pattern), wherein a distance P between any two adjacent second electrodes 12 in the horizontal direction is 100 μm to 2000 μm. Optionally, P is 300 μm to 1000 μm. It could be understood that a width of the first electrode 9 is limited by a width of the first groove 8, and a width of the second electrode 12 is limited by a width of the second groove 11.

The widths of the first groove 8 and the second groove 11 may be 3 μm to 20 μm, for example, 3 μm to 10 μm. Depths of the first groove 8 and the second groove 11 may be 1 µm to 5 µm, for example, 2 µm to 4 µm.

Each of the first electrode 9 and the second electrode 12 may include any one or more of silver, gold, copper and aluminum. For example, the first electrode 9 and the second electrode 12 may be made of silver. Needless to say, any material is possible as long as it is ensured that the materials of the first electrode 9 and the second electrode 12 are a conductive metal.

Figure 2:
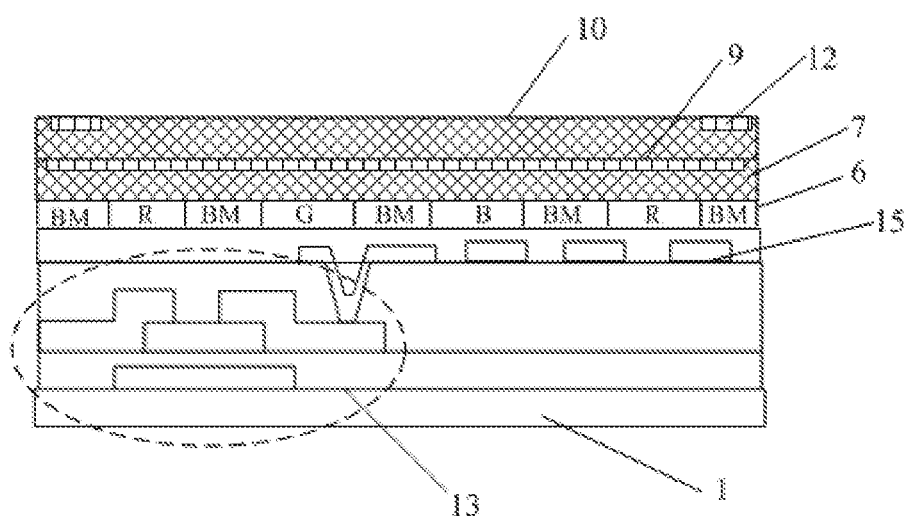

The display substrate according to an embodiment of the present disclosure may be implemented to have a configuration shown in FIGS. 1 and 2.

As shown in FIG. 1, a display substrate according to an embodiment of the present disclosure is an organic light emitting diode (OLED) substrate, which includes a base substrate 1, a plurality of organic electroluminescent devices 2 provided on the base substrate 1, a color filter layer 6 provided on a side of the plurality of organic electroluminescent devices 2 distal to the base substrate 1, and a first planarization layer 7 and a second planarization layer 10 sequentially provided on the color filter layer 6. The first planarization layer 7 is provided with first grooves 8, the second planarization layer 10 is provided with second grooves 11, and orthogonal projections of the first grooves 8 on the base substrate 1 intersect with orthogonal projections of the second grooves 11 on the base substrate 1. First electrodes 9 are filled in in the first grooves 8, and second electrodes 12 are filled in the second grooves 11. The color filter layer 6 includes a plurality of color filter blocks (e.g., a red color filter block, a green color filter block, and a blue color filter block). Positions of the organic electroluminescent devices 2 correspond to positions of the color filter blocks. For example, orthogonal projections of the organic electroluminescent devices 2 on the base substrate 1 substantially overlap with orthogonal projections of the color filter blocks on the base substrate 1. That is, the color filter blocks are provided on a light-exiting surface side of the organic electroluminescent devices 2.

The plurality of organic electroluminescent devices 2 may include red organic electroluminescent devices, green organic electroluminescent devices and blue organic electroluminescent devices. In this case, the color filter layer 6 adopt color filter blocks of three colors, namely, red filter blocks R, green filter blocks G and blue filter blocks B. The red organic electroluminescent devices are provided correspondingly to the red filter blocks R, the green organic electroluminescent devices are provided correspondingly to the green color filter blocks G, and the blue organic electroluminescent devices are provided correspondingly to the blue color filter blocks B. In the OLED substrate with such structure, a circular polarizer can be omitted, so that a display panel using the OLED substrate is thinner and lighter, while achieving improved brightness and color purity.

Needless to say, the plurality of organic electroluminescent devices 2 each may be white organic electroluminescent devices 2. In this case, the color filter layer 6 adopts color filter blocks of three colors, namely, red filter blocks R, green filter blocks G and blue filter blocks B. The OLED substrate with such structure can achieve ultra-high resolution (larger than 600 ppi), while avoiding technical problems occurring in the process of evaporating a light-emitting material using a FMM (fine metal mask).

Needless to say, an encapsulation layer for encapsulating the organic electroluminescent devices 2 is further provided between the organic electroluminescent devices 2 and the color filter layer 6. The encapsulation layer comprises N groups of thin films and a protective layer 5 provided on the groups of thin films, where N is an integer greater than or equal to 1, and each group of thin films includes an inorganic film layer 3 and an organic film layer 4 sequentially arranged in a direction away from the organic electroluminescent device(s) 2. The inorganic film layer 3 is a barrier layer for preventing water, oxygen and the like from polluting the organic electroluminescent device(s) 2, and the organic film layer 4 is a planarization layer for providing a planar surface. The protective layer 5 is an inorganic film layer 3 for preventing pollutants such as water and oxygen from the outside from polluting the organic electroluminescent device(s); alternatively, the protective layer 5 is an organic film layer 4 for providing a planar surface.

The organic film layer 4 has a thickness larger than 3 µm, for example, in the range of 3 µm to 12 µm, and in the range of 4 µm to 8 µm. The inorganic film layer 3 is thinner than the organic film layer 4, and has a thickness of, for example, 0.2 µm to 1.0 µm.

The organic electroluminescent device 2 may be a top-emission type organic electroluminescent device 2 or a bottom-emission type organic electroluminescent device 2. A top-emission type organic electroluminescent device 2 generally includes an anode layer, a light emitting layer (provided in openings of the pixel define layer 21) and a cathode layer sequentially provided (in order of preparation) on the base substrate 1. A bottom-emission type organic electroluminescent device 2 generally includes a cathode layer, a light emitting layer (provided in openings of the pixel define layer 21) and an anode layer sequentially provided (in order of preparation) on the base substrate 1. In an embodiment of the present disclosure, the first electrode 9 and the second electrode 12 are optionally arranged at a position corresponding to the pixel define layer 21.

This is because the pixel define layer 21, i.e., a barricade wall, is configured to define a position of the light emitting layer in each pixel, and the light emitting layer is a pixel area for display. Therefore, by providing the first electrode 9 and the second electrode 12 at the position corresponding to the pixel define layer 21, the light emitting layer is not shielded, and thus an aperture ratio of the pixel is not affected.

As shown in FIG. 2, a display substrate according to an embodiment of the present disclosure is a color filter on array (COA) substrate, which includes a base substrate 1, a thin film transistor 13 provided on the base substrate 1, a pixel electrode 15 connected to a drain of the thin film transistor 13, a color filter layer 6 provided on a side of the pixel electrode 15 distal to the base substrate 1, and a first planarization layer 7 and a second planarization layer 10 sequentially provided on a side of the color filter layer 6 distal to the base substrate 1. First grooves 8 are provided on the first planarization layer 7, second grooves 11 are provided on the second planarization layer 10, and orthogonal projections of the first grooves 8 on the base substrate 1 intersect with orthogonal projections of the second grooves 11 on the base substrate 1. First electrodes 9 are filled in the first grooves 8, and second electrodes 12 are filled in the second grooves 11.

Figure 6:
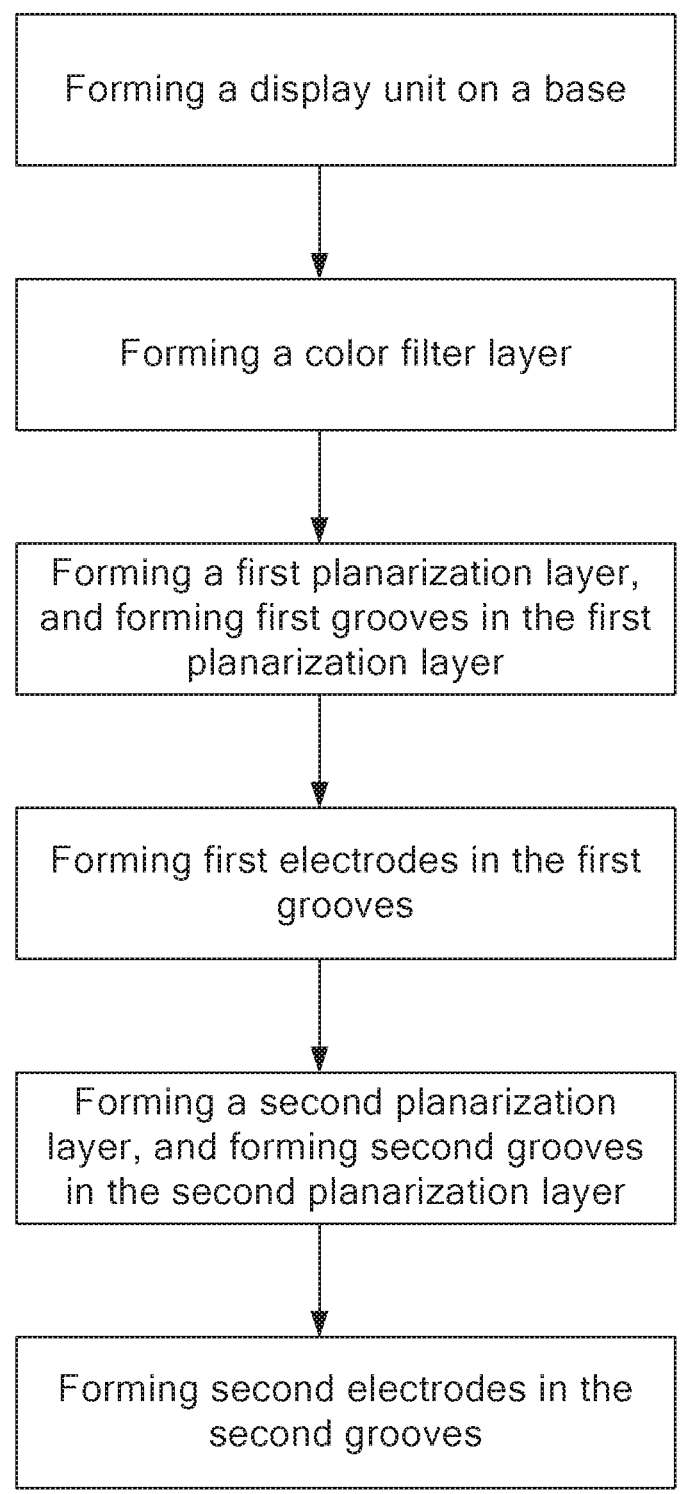
FIG. 6 is a flowchart of a manufacturing method of a display substrate according to an embodiment of the present disclosure.

In another aspect, embodiments of the present disclosure provide a manufacturing method of a display substrate, and the display substrate is a display substrate according to an embodiment of the present invention. Referring to FIG. 6, the manufacturing method includes the following steps.

Step 1 includes: forming a display unit on a base substrate 1.

Figure 7:
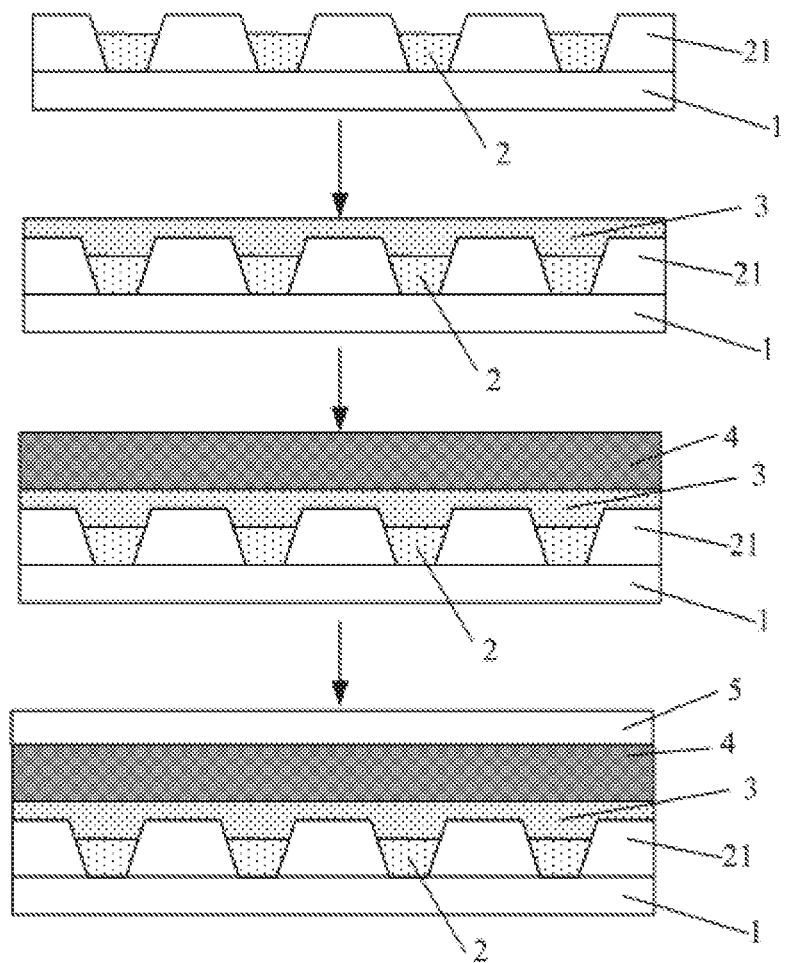
FIGS. 7 and 8 are schematic diagrams illustrating a first step of the manufacturing method of a display substrate according to an embodiment of the present disclosure.

Specifically, as shown in FIG. 7, the display substrate is an OLED substrate. Step 1 specifically includes: 1) forming an anode conductive film on the base substrate 1 by sputtering, and forming a pattern including an anode layer by a patterning process; 2) forming, on the base substrate 1 on which the anode layer 1 is formed, a pattern including a pixel define layer 21 by a patterning process; 3) forming, on the base substrate 1 on which the pixel define layer 21 is formed, a light emitting layer in an opening of the pixel define layer 21 by using a vacuum evaporation process; 4) forming, on the base substrate 1 on which the light emitting layer is formed, a cathode layer by using a vacuum evaporation process; and 5) forming an encapsulation layer on the base substrate 1 on which the cathode layer is formed. The step of forming an encapsulating layer (description is given by taking a case where one group of thin films is included as an example) includes steps of: first, using a reactive sputtering method to form a first inorganic film layer 3 by sputtering in a mixed atmosphere of oxygen and argon under vacuum environment, wherein the first inorganic film layer 3 covers the organic electroluminescent device 2 to prevent water, oxygen and the like from entering into the organic electroluminescent device 2 to affect service life of the organic electroluminescent device 2; then, forming a first organic film layer 4 by inkjet printing (IJP); and finally, forming a protective layer 5. Needless to say, a method for manufacturing the organic electroluminescent device 2 may further includes steps of forming functional film layers such as a hole injection layer, a hole transport layer, an electron injection layer, an electron transport layer, etc., which are not described in detail herein. It should be noted that the above description is given by taking a case where a top-emission organic electroluminescent device 2 is manufactured as an example, and it could be understood that a bottom-emission organic electroluminescent device may be manufactured according to the same method except that the order in which the anode layer and the cathode layer are manufactured is different.

Figure 8:
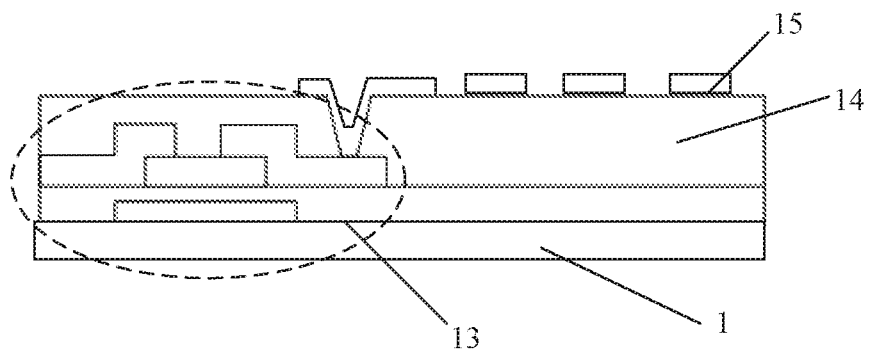

As shown in FIG. 8, the display substrate is a COA substrate, and step 1 includes: 1) forming a thin film transistor 13 (including steps of forming a gate, a source and a drain) on the base substrate 1; 2) forming a passivation layer 14 and forming a via hole in the passivation layer 14 at a position corresponding to the drain of the thin film transistor 13 by etching; and 3) forming a pattern including a pixel electrode 15 by a patterning process, the pixel electrode 15 being connected to the drain of the thin film transistor 13 through the via hole.

Figure 9:
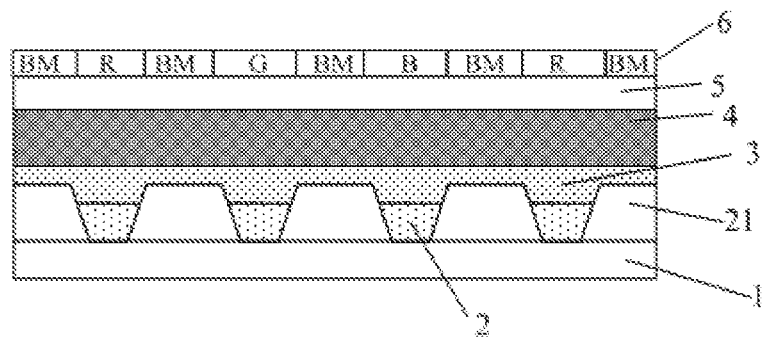
FIG. 9 is a schematic diagram illustrating a second step of a manufacturing method of a display substrate according to an embodiment of the present disclosure.

Step 2 includes: forming a color filter layer 6 (including black matrix blocks and color filter blocks) on the base substrate 1 subjected to step 1, as shown in FIG. 9.

The step specifically includes: forming, on the base substrate 1 on which the display unit is formed, black matrix (BM) blocks by processes of coating, exposing, developing, baking and the like; forming, on the black matrix blocks, the color filter blocks 1, i.e., color filter blocks of for example, red, green and blue (RGB) sub-pixels, respectively by process of coating, exposing, developing, baking and the like. The black matrix blocks and the color filter blocks are arranged alternately.

Figure 10:
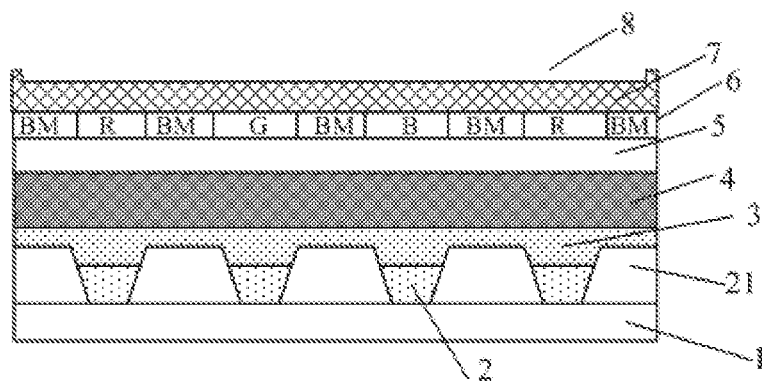
FIG. 10 is a schematic diagram illustrating a third step of a manufacturing method of a display substrate according to an embodiment of the present disclosure.

Step 3 includes: forming a first planarization layer 7 on the base substrate 1 subjected to step 2, and forming a plurality of first grooves in the first planarization layer 7, as shown in FIG. 10.

Specifically, step 3 may include: first, forming the first planarization layer 7 by inkjet printing (IJP); and then, performing imprinting on a surface of the first planarization layer 7 distal to the base substrate 1 to form the first grooves 8 on the surface of the first planarization layer 7, wherein the imprinting process on the surface of the first planarization layer 7 may be performed in $N_2$ environment or vacuum environment, for example, the imprinting process may be performed in $N_2$ environment.

Figure 11:
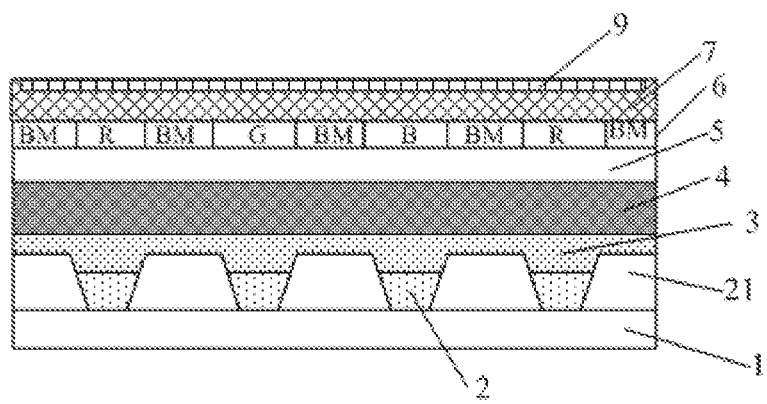
FIG. 11 is a schematic diagram illustrating a fourth step of a manufacturing method of a display substrate according to an embodiment of the present disclosure.

Step 4 includes: forming first electrodes 9 in the first grooves 8, as shown in FIG. 11.

Specifically, step 4 may include: first, printing metal nano-particle ink, which may particularly be silver nano-particle ink, into the first grooves 8 by inkjet printing; and then performing conductive treatment on the metal nano-particle ink by using photon sintering or laser pulse sintering to form the first electrodes 9. It should be noted that the sintering is performed such that high sintering is performed only on the metal nano-particle ink in the first grooves 8, which will not affect the organic electroluminescent device 2 below the film layer in which the first grooves 8 are located.

Figure 12:
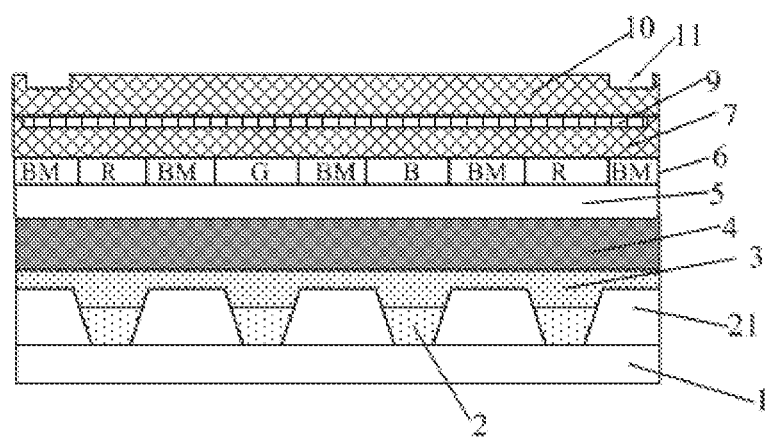
FIG. 12 is a schematic diagram illustrating a fifth step of a manufacturing method of a display substrate according to an embodiment of the present disclosure.

Step 5 includes: forming a second planarization layer 10 and forming a plurality of second grooves 11 in the second planarization layer 10 using the same method as in step 3, as shown in FIG. 12.

Step 6 includes: forming second electrodes 12 in the second grooves 11 using the same method as in step 4, as shown in FIG. 1 or 2.

Thus, manufacturing of the display substrate is completed.

In another aspect, embodiments of the present disclosure provide a display apparatus including the display substrate according to the embodiments of the present disclosure. Therefore, the display apparatus of the embodiments of the present disclosure has high integration and multiple functions, and can be applied in a flexible display.

The display apparatus may be any product or component having a display function such as an electronic paper, an OLED panel, a cell phone, a tablet computer, a television, a display, a notebook computer, a digital photo frame, a navigator, etc.

It could be understood that the above embodiments are merely exemplary embodiments adopted for describing the principle of the present invention, but the present invention is not limited thereto. Various variations and improvements may be made by those of ordinary skill in the art without departing from the spirit and essence of the present invention, and these variations and improvements shall also be regarded as falling into the protection scope of the present invention.

What is claimed is:
1. A display substrate, comprising:
   a base substrate;
   a plurality of organic electroluminescent devices provided on the base substrate and defined by a pixel define layer;
   a color filter layer provided on the plurality of organic electroluminescent devices;
   a planarization layer provided on a surface of the color filter layer distal to the plurality of organic electroluminescent devices;
   a plurality of first electrodes and a plurality of second electrodes provided in the planarization layer;
   an encapsulation layer provided between the plurality of organic electroluminescent devices and the color filter layer, the encapsulation layer comprising an inorganic film layer, an organic film layer and a protective layer,
   wherein the planarization layer comprises a first planarization layer and a second planarization layer, the plurality of first electrodes are embedded in the first planarization layer, and the plurality of second electrodes are embedded in the second planarization layer;

wherein the color filter layer comprises color filter blocks and black matrix blocks alternately arranged in a horizontal direction, and orthographic projections of the black matrix blocks on the base substrate completely cover orthographic projections of the first electrode intersecting orthographic projections of the second electrodes on the base substrate, and wherein an orthographic projection of the pixel define layer on the base substrate completely covers the orthographic projections of the first electrodes and the second electrodes on the base substrate.

2. The display substrate of claim 1, wherein a plurality of first grooves are provided in the first planarization layer, a plurality of second grooves are provided in the second planarization layer, and orthographic projections of the plurality of first grooves on the base substrate intersect with orthographic projections of the plurality of second grooves on the base substrate; and each of the plurality of first grooves is filled with a respective one of the plurality of first electrodes; and each of the plurality of second grooves is filled with a respective one of the plurality of second electrodes.

3. The display substrate of claim 1, wherein the organic electroluminescent devices and the color filter blocks in the color filter layer are provided correspondingly.

4. The display substrate of claim 3, wherein the plurality of organic electroluminescent devices comprise a red organic electroluminescent device, a green organic electroluminescent device and a blue organic electroluminescent device.

5. The display substrate of claim 3, wherein each of the plurality of organic electroluminescent devices is a white organic electroluminescent device.

6. The display substrate of claim 1, wherein the organic electroluminescent device comprises: an anode layer, a light-emitting layer and a cathode layer; wherein the anode layer is provided on the base substrate, the pixel define layer is provided on the anode layer and has an opening exposing a part of the anode layer; the light emitting layer is provided in the opening of the pixel define layer and on the part of the anode layer exposed by the opening; and the cathode layer is provided on the pixel define layer and the light emitting layer; alternatively, the cathode layer is provided above and on the base substrate, the pixel define layer is provided above and on the cathode layer and has an opening exposing a part of the cathode layer; the light emitting layer is provided in the opening of the pixel define layer and on the part of the cathode layer exposed by the opening; and the anode layer is provided above and on the pixel define layer and the light emitting layer.

7. The display substrate of claim 1, wherein the plurality of first electrodes and the plurality of second electrodes intersect with each other, and a distance between two adjacent second electrodes in a horizontal direction is 100 μm to 2000 μm.

8. The display substrate of claim 2, wherein each of the first grooves and the second grooves has a width of 3 μm to 20 μm.

9. The display substrate of claim 2, wherein each of the first grooves and the second grooves has a depth of 1 μm to 5 μm.

10. The display substrate of claim 1, wherein the first electrodes and the second electrodes comprise at least one of silver, gold, copper and aluminum.

11. A display apparatus, comprising the display substrate of claim 1.

* * * * *